United States Patent [19]

Burger

[11] Patent Number: 4,628,144
[45] Date of Patent: Dec. 9, 1986

[54] METHOD FOR CONTACT RESISTIVITY MEASUREMENTS ON PHOTOVOLTAIC CELLS AND CELL ADAPTED FOR SUCH MEASUREMENT

[75] Inventor: Dale R. Burger, Pasadena, Calif.

[73] Assignee: California Institute of Technology, Pasadena, Calif.

[21] Appl. No.: 501,909

[22] Filed: Jun. 7, 1983

[51] Int. Cl.[4] .................... H01L 31/04; G01R 27/14
[52] U.S. Cl. .................................. 136/256; 29/574; 136/290; 324/64; 357/68
[58] Field of Search .............. 324/64; 136/256, 290; 357/30, 65, 68; 29/574

[56] References Cited

U.S. PATENT DOCUMENTS 4,218,650  8/1980  Matzen ............................ 324/62

OTHER PUBLICATIONS

D. E. Reimer, *Conf. Record*, 13th IEEE Photovoltaic Specialists Conf., (1978), pp. 603–608.
O. Paz et al., *IBM Tech. Disc. Bull.*, vol. 23, pp. 1053–1055 (1980).
H. H. Berger, *J. Electrochem. Soc.*, vol. 119, pp. 506–513 (1972).
S. J. Proctor et al., *IEEE Electron Device Letters*, vol. EDL-3, pp. 294–296 (1982).
H. B. Harrison, *Proc. IREE Australia*, pp. 95–100 (1980).
G. K. Reeves et al., *IEEE Electron Device Letters*, vol. EDL-3, pp. 111–113 (1982).
G. K. Reeves et al., *Conf. on Microelectronics*, Adelaide, Australia, May 1982.
H. H. Berger, *Digest Tech. Papers*, 1969 Int'l. Solid State Circuit Conf., pp. 160–161.

Primary Examiner—Aaron Weisstuch
Attorney, Agent, or Firm—Freilich, Hornbaker, Rosen & Fernandez

[57] ABSTRACT

A method is disclosed for scribing at least three grid contacts of a photovoltaic cell to electrically isolate them from the grid contact pattern used to collect solar current generated by the cell, and using the scribed segments for determining parameters of the cell by a combination of contact end resistance (CER) measurements using a minimum of three equally or unequally spaced lines, and transmission line modal (TLM) measurements using a minimum of four unequally spaced lines. TLM measurements may be used to determine sheet resistance under the contact, $R_{sk}$, while CER measurements are used to determine contact resistivity, $\rho_c$, from a nomograph of contact resistivity as a function of contact end resistance and sheet resistivity under the contact. In some cases, such as the case of silicon photovoltaic cells, sheet resistivity under the contact may be assumed to be equal to the known sheet resistance, $R_s$, of the semiconductor material, thereby obviating the need for TLM measurements to determine $R_{sk}$.

11 Claims, 6 Drawing Figures

| VOLTAGE PROBE POSITIONS | CURRENT PROBE POSITIONS | | |
|---|---|---|---|
| | $I_{1-2}$ | $I_{1-3}$ | $I_{2-3}$ |
| $V_{1-2}$ | A | D | G |
| $V_{1-3}$ | B | E | H |
| $V_{2-3}$ | C | F | I |

METHOD FOR CONTACT RESISTIVITY MEASUREMENTS ON PHOTOVOLTAIC CELLS AND CELL ADAPTED FOR SUCH MEASUREMENT

ORIGIN OF INVENTION

The invention described herein was made in the performance of work under a NASA contract, and is subject to the provisions of Public Law 96-517 (35 USC 202) in which the Contractor has elected to retain title.

BACKGROUND OF THE INVENTION

This invention relates to a method for measuring the resistivity of contacts on photovoltaic cells, and more particularly to a method for measuring contact resistivity of collector grid contacts using isolated segments of grid lines for contact end resistance and transmission line model measurements.

Measurement of contact resistance $R_c$ is of increasing importance in two semiconductor technologies: integrated circuits (IC) and photovoltaics (PV). The sizes of IC device features are continually decreasing, which causes an increase in the resistance of the conductor/semiconductor interface. A contact resistance $R_c$ of less than $10^{-6}$ ohm-cm$^2$ is now desirable for very large scale integration(VLSI) applications. The practice is to produce a test pattern at some unused area of the VLSI. Conventional tests are then conducted to determine the parameters of the VLSI for quality control without affecting the operational circuit pattern.

Most PV manufacturers have not yet had to be concerned about contact resistance. Photovoltaic devices using crystalline silicon typically have contact resistance losses of less than 0.01% of the generated power. For nonconcentrating solar power applications, this loss is acceptable. However, if a PV concentrator cell is working at a 100-sun level, a change in the contact resistance can cause an appreciable power loss. Similarly, if the contact resistance of conductive coatings or metallizations on thin-film PV devices is too high, or changes with time, contact resistance can have important research and development implications. As a result of this increased interest, the various contact resistance measurement methods used for semiconductors have been examined.

Contact resistance can be measured by either ac or dc methods. Because ac methods introduce detrimental parasitic influences and, in common with dc measurement, require determination of small voltages or small voltage differences, only dc measurement techniques are of real interest. H. H. Berger reviewed the dc contact resistance measurement techniques in a paper titled "Contact Resistance and Contact Resistivity," *J. Electrochem. Soc.*, Vol. 119, No. 4, pp 506-513, 1972. At that time he listed five different methods: twin contact, differential, extrapolation, interface probing and transmission line model (TLM). The analyses done by Berger showed that the differential, interface probing, and TLM approaches were potentially the three best. All three methods require specialized sample structures, although it is shown below that the TLM method can obviate this by use of modified portions of the standard PV-device grid-line metallization. Berger and others have improved on the TLM method.

More recently a direct contact resistance (DCR) measurement method was proposed by Proctor and Linholm in a paper titled "A Direct Measurement of Interfacial Contact Resistance," *Electron. Device Letters*, EDL-3 No. 5, May 1982, pp 294-296. This direct method has potential application in IC and PV research and development. However, the direct method requires three photolithographic steps to prepare a sample. This is a serious limitation when investigating samples of production crystalline PV devices. DCR measurement on many proposed thin-film PV devices would be impossible due to lack of a diffused layer. For these reasons, a different measurement approach is required for PV devices.

In all of the TLM approaches it is necessary to account for the effect of contact end resistance, $R_E$. This effect was noted by Berger, supra. Later work reported by Harrison in a paper titled "Characterising Metal Semiconductor OHMIC Contacts," *Proc. IREE Aust.*, pp 95-100, used the contact end resistance measurement and the contact resistance measurement to determine the attenuation constant for electrically short contacts. Subsequent work by Reeves and Harrison, reported in a paper titled "Obtaining the Specific Contact Resistance from Transmission Line Model Measurements," *Electron. Device Lett.*, EDL-3 No. 5, May 1982, pp 111-113, extended the utility of contact end resistance measurement to the determination of modifications in sheet resistivity under contacts due to the alloying/sintering process.

The literature does not disclose any physical explanation for the phenomenon of contact end resistance. The best definition is by Harrison, supra: "$R_E$ is defined as the ratio of the contact output voltage V(d) to the contact input current I(o) when the contact output current is zero." While this definition is accurate, it does not provide a basis for understanding the phenomenon.

In a paper titled "Ohmic Contacts for VLSI Device Applications," *Conf. on Microelectronics, Adelaide, Australia* 12-14 May 1982, Reeves and Harrison showed a schematic representation of the various resistances found when measuring resistances of contacts. A similar representation is included here as FIG. 1. This shows where the contact end resistance may be found. Another view of a contact by Reeves and Harrison, and earlier by Berger in a paper titled "Contact Resistance on Diffused Resistors," *Dig. Techn. Papers,* 1969 IEE International Solid-State Circuit Conference (ISSCC) pp 160, 161, contains lines representing current flow and flux as shown in FIG. 2 herein.

The important concept here is the reduction of current flux across the metal-semiconductor interface as a function of distance from the leading edge of the contact. According to convention, the nature of a contact changes from an electrically short contact to an electrically long contact according to the following relationship:

$$d \geq 2/\alpha \tag{1}$$

where:
  d = contact length, cm
  $\alpha$ = attenuation constant, cm$^{-1}$
  The attenuation constant is defined by:

$$\alpha = (R_{sk}/\rho_c)^{\frac{1}{2}} \tag{2}$$

where:
  $R_{sk}$ = sheet resistance under the contact, $\Omega/\square$
  $\rho_c$ = contact resistivity, $\Omega$-cm$^2$ If the electrically short contact ($\alpha d < 2$) is visualized as a combination of a high contact resistance $R_c$ and a low sheet resistance $R_{sk}$ under the contact, then some of the current between contact 1 and contact 2 in FIG. 1 will have to flow through the conductor/semiconductor interface at the right edge of contact 2. A voltage measurement between contact 2 and contact 3 will include the interface at the right edge of contact 2 and thus there will be a voltage between contacts 2 and 3 due to a portion of the current between contacts 1 and 2. That voltage is a measurement of contact end resistance $R_E$ for contact 2. If the contact is electrically long ($\alpha d \geq 2$), then there will be little or no current flow across the interface at the right edge of contact 2 and therefore a very small, or no, contact end resistance, $R_E$, measured. The equations for contact resistance and contact end resistance from Berger, *J. Electrochem. Soc.*, Vol. 119, No. 4, pp 506–513, 1972, have been reformulated as:

$$R_c = (R_{sk}\rho_c)^{\frac{1}{2}} / (w \tanh [d(R_{sk}/\rho_c)^{\frac{1}{2}}]) \quad (3)$$

$$R_E = (R_{sk}\rho_c)^{\frac{1}{2}} / (W \sinh [d(R_{sk}/\rho_c)^{\frac{1}{2}}]) \quad (4)$$

where:
$R_c$ = contact resistance, $\Omega$
$R_E$ = contact end resistance, $\Omega$
$R_{sk}$ = sheet resistivity under the contact, $\Omega/\square$
$\rho_c$ = contact resistivity, $\Omega\text{-cm}^2$
d = width of collector grid line, cm
w = length of segment of collector grid line, cm Equations (3) and (4) show that contact resistance is dependent upon both the quality of the contact and the modification of the semiconductor surface due to application of the contact. Work by Reeves and Harison, *Electron. Device Lett.*, EDL-3, No. 5, May 1982, pp 111–113 has shown that the sheet resistance of a lightly doped silicon surface ($R_s = 2100\ \Omega/\square$) may change by a factor of 5 while a gallium arsenide surface may change by a factor of 20 when metal is applied by alloying or sintering. Heavily doped silicon ($R_s = 40\ \Omega/\square$), however, should change very little due to metallization sintering since it is already degenerate. This fact allows the substitution of a measured sheet resistance, $R_s$, value for the sheet resistivity under the contact, $R_{sk}$, for most present production solar cells. For gallium arsenide or other compound semiconductors, if modification of the sheet resistivity due to contact application can be shown to be predictable, then the modified value can be used. This substitution should not affect process control inspection since the determination of contact resistivity of poor contacts (using $\rho_c \leq 1 \times 10^{-3}\ \Omega\text{-cm}^2$ as a definition of a good contact) is relatively insensitive to sheet resistivity values. This relationship is illustrated in FIG. 3.

Most contact resistance measurements for process control are made by using the TLM method along with a contact end resistance measurement. The TLM measurement relies upon a special pattern of three unequally spaced parallel contacts and the following equations from Berger, *J. Electrochem. Soc.*, Vol. 119 No. 4, pp 506–513, 1972:

$$R_c = \frac{R_2 L_1 - R_1 L_2}{2(L_1 - L_2)} \quad (5)$$

$$R_s = \frac{(R_1 - R_2)w}{L_1 - L_2} \quad (6)$$

where:
$R_1$, $R_2$ = measured resistance values, $\Omega$
$L_1$, $L_2$ = line-to-line distances, cm Note that since most PV cells have equally spaced grid lines for optimum device performance, the TLM approach cannot be used without modification of the grid lines because the denominator of equations (5) and (6) becomes zero.

OBJECTS AND SUMMARY OF THE INVENTION

An object of this invention is to provide a method for measuring the resistivity of collector grid contacts on photovoltaic cells.

A more specific object is to provide a method for measuring the resistivity of collector grid contacts on a photovoltaic cell without appreciably degrading its efficiency so that the cell tested may thereafter be used.

Still another object is to provide for the use of TLM measurement techniques on PV cells to determine sheet resistance under the contacts, $R_{sk}$.

These and other objects of the invention are achieved by making parallel cuts through grid contacts at right angles to an array of at least three parallel collector grid contacts on photovoltaic cells. The depth of the cut must be sufficient to isolate segments of the parallel contacts between the cuts. A series of voltage measurements between combinations of the three segments with a constant current applied between other pairs will produce as many as six separate contact end resistance measurements, all of which should be the same. Each contact end resistance, $R_E$, is determined from the measured voltage output, $V_o$, between two segments, and the applied current, $I_{in}$, between one of the segments and a third segment, or the equivalent voltage determined by subtracting measured voltages across the other two pairs of segments, such as $V_{1-3} - V_{2-3}$ for an applied current $I_{2-3}$, where the subscripts designate the involved segments numbered in sequence, or the voltage measurements across one pair of adjacent terminals, such as $V_{1-2}$, with first a current $I_{1-2}$ applied to those two segments and then a current $I_{1-3}$ applied across from the first to the third segment. From a known or measured sheet resistance, $R_s$, and the measured end resistance, $R_E$, the contact resistivity, $\rho_c$, is determined from a known relationship of $\rho_c$ as a function of sheet resistance $R_s$ and contact end resistance $R_E$. This assumes the sheet resistance under the contact, $R_{sk}$, is substantially equal to sheet resistance, $R_s$, which is normally the case for heavily doped silicon. For other semiconductor materials, where $R_{sk}$ is not substantially equal to $R_s$, the sheet resistance under the contact may be measured by the transmission line model (TLM) technique using at least four unequally spaced segments. The TLM technique consists of inducing a current, I, between a first pair of the unequally spaced segments and measuring voltage, V, between the two, noting the resistance, $R = V/I$, and length of current path between the two, and repeating the procedure between all of the remaining unequally spaced segments, from which contact resistance, $R_c$, is determined.

The novel features of the invention are set forth with particularity in the appended claims. The invention will best be understood from the following description when read in conjunction with the accompanying drawings.

DESCRIPTION OF PREFERRED EMBODIMENTS

Figure 4:
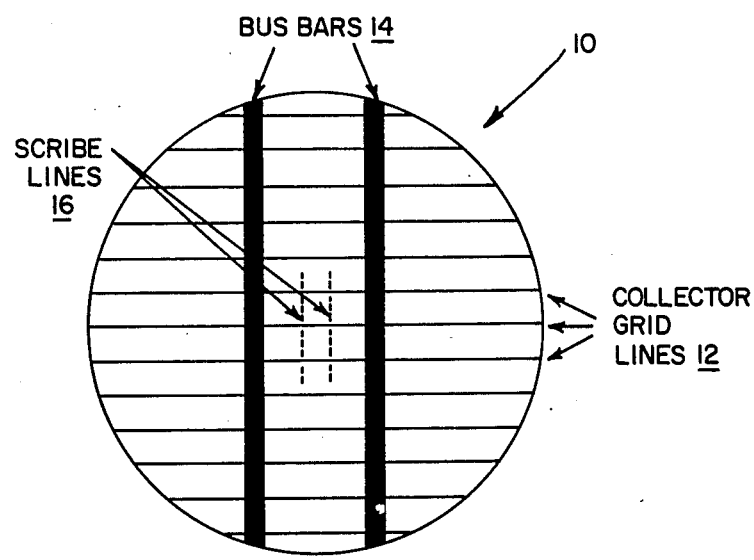
FIG. 4 illustrates a photovoltaic cell with a collector grid pattern having three grid contacts isolated by scribing two parallel lines at right angles to at least three grid contacts.

The present invention will now be described with reference to FIG. 4 which illustrates a PV cell 10 having collector grid lines 12 and bus bars 14. Two parallel scribe lines 16 are cut through at least three grid lines using a laser or a fine diamond wheel. The scribe lines are perpendicular to the grid lines, leaving three isolated contact segments that are equally spaced, although in practice they need not be equally spaced, and as will be noted more fully hereinafter, are preferably not equally spaced. End contact resistance measurements are made using these three segments, using the known technique described with reference to FIG. 1. The contacts numbered 1, 2, and 3 in FIG. 1 may be the three isolated grid contact segments shown in FIG. 4. After testing, the cell may be used in a solar array because all that has been lost from the collector grid is the use of a portion of the isolated segments between the bus bars.

Figures 5, 6:
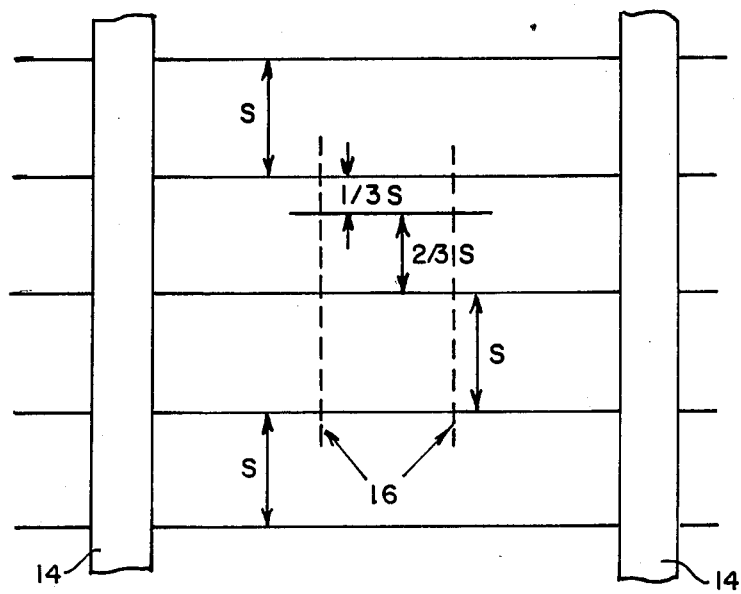
FIG. 5 is a table of voltage measurements between pairs of three isolated contact segments in response to applied current between pairs of the three isolated segments, where the segments used for the measurements are indicated by subscripts, and the voltage values are indicated by the letters A through I.
FIG. 6 illustrates a modification in the collector grid pattern between the scribed lines for collection of both contact end resistance measurements and transmission line measurements (TLM).

In making contact end resistance measurements using three contact segments, a series of measurements A through I in a table shown in FIG. 5 will produce six separate determinations of end resistance, $R_E$. The table lists in columns voltage measurements $V_{1-2}$, $V_{1-3}$ and $V_{2-3}$ across three pairs of contacts while a constant current is applied through specified contacts, where the contacts used to apply the current and for the voltage measurements are designated by subscripts. For example, while applying the current through probes against contacts 1 and 2, a voltage measurement A is made between contacts 1 and 2, and voltage measurements B and C are made between respective pairs of contacts 1 and 3, and 2 and 3. The end resistance $R_E$ can be determined directly from the voltage measurements as measured between that pair of probes and between the two outside pairs, such that the voltage measurement indirectly measured is across the remaining pair between the two end contacts. Similar measurements may be indirectly determined by leaving the voltmeter connected to the same pair of selected contacts 1-2, or 2-3 and applying the current between the same pair of selected contacts and between the two end contacts. For instance, with the voltmeter connected across contacts 1 and 2, and the current between contacts 1 and 3, the voltage between contacts 1 and 2 measured is D, which includes all of the voltage due to contact end resistance. Consequently, if the voltage A is measured for the current between contacts 1 and 2, the voltage C between contacts 2 and 3 due to end resistance of contact 2 is determined by subtracting voltage D from the voltage A. Similarly subtracting F from I yields the voltage C. The determination of contact end resistance from the differences between measurements A and B, and differences between measurements H and I, can be made in a similar way. With the current applied between contacts 1 and 2 in one case, and between 2 and 3 in the other, the separate voltage measurements are made. Contact end resistance is then determined from the ratio of voltage differences to applied current, namely $A-B/I_{1-2}$ and $H-I/I_{2-3}$. The six values of $R_E$ that can thus be determined provide a check of measurement accuracy. Another check available on the measurements of table 5 is from the equality of E with the sum of B and H.

Figure 1:
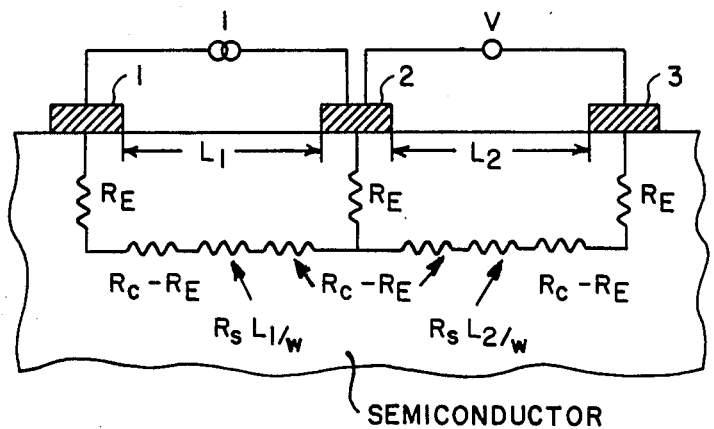
FIG. 1 shows a schematic representation of various resistances found when measuring contact resistance.
Figure 2:
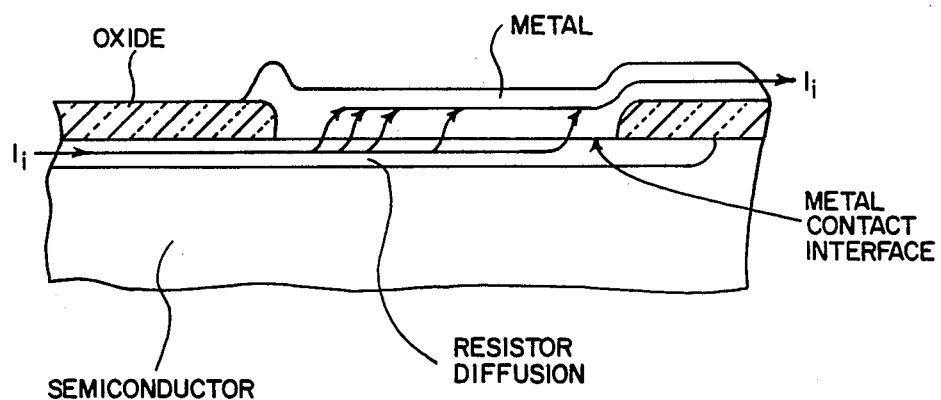
FIG. 2 is a cross section of a contact interface showing current flow and flux into the metal contact through the interface.

FIG. 1 illustrates the arrangement of a constant current source I and a volt meter V for the voltage measurement C shown in the table of FIG. 5. Since the current flow is only between contacts 1 and 2, the only voltage that can be measured is due to the contact end resistance of contact 2. By definition, $R_E$ is the ratio of the contact output voltage $V_{2-3}$ to the contact input current $I_{1-2}$ when the contact output current $I_{2-3}$ is zero. Consequently, the end resistance of contact 2 is determined directly by the ratio $C/I_{1-2}$.

It should be noted that the difference $A-B$ and $H-I$ equal to respective voltages C and G for the application of current probes to respective pairs of terminals 1 and 2, and 2 and 3. Since it is easier to measure C and G directly, the difference equivalents would normally be used only as a check. Note that in these two equivalent differences, the current flows between the same pair of probes and the voltage will be collected by the remaining nonisolated grid contacts. Having isolated the segments, contact resistance or resistivity can be determined using contact end resistance measurements. Then the photovoltaic cell can be placed back in inventory or in service, depending upon whether the measurements are made for quality control in production or analysis of problems in the field.

Figure 3:
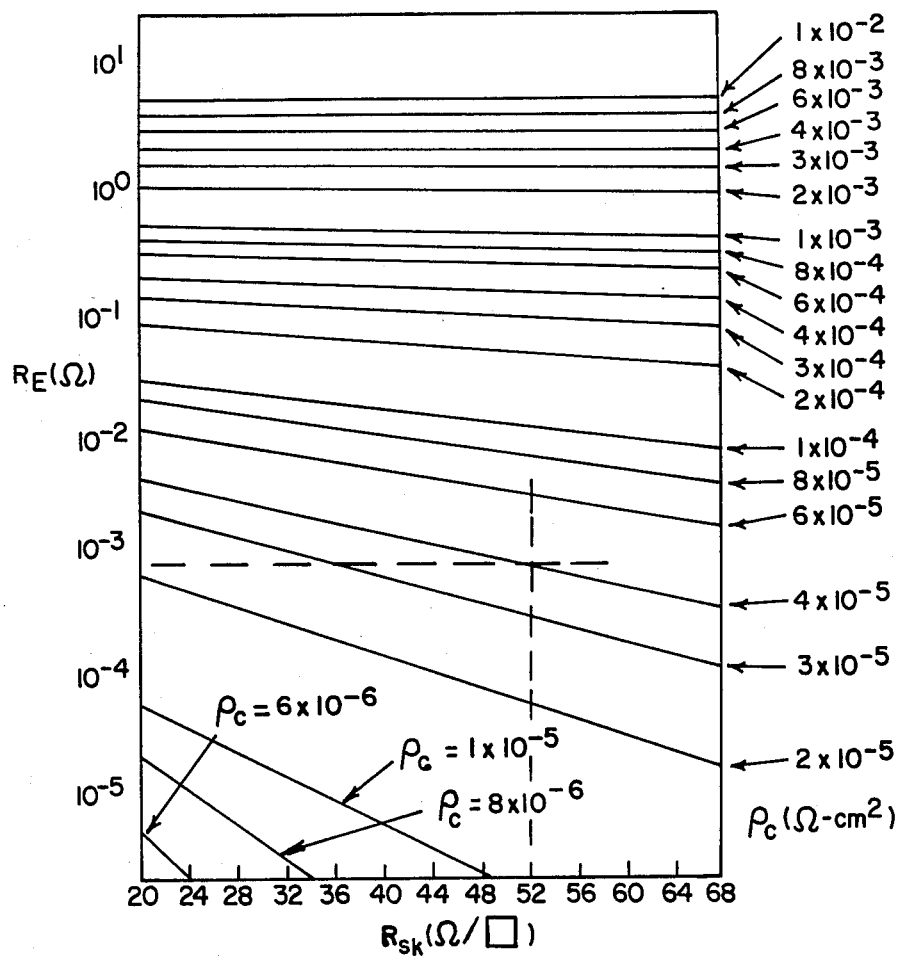
FIG. 3 is a nomograph of contact resistivity, $\rho_c$, as a function of contact end resistance and sheet resistivity under the contact for particular values of d and w.

This simple series of voltage measurements provides an easy way to determine contact resistivity, as compared to the TLM measurement method. If sheet resistance ($R_{sk}$) under the contact is assumed to be equal to sheet resistance $R_s$, and $R_{sk}$ is known to be a particular value $R_s$, and $R_E$ is determined, resistivity $\rho_c$ for the contact can be determined from a contact resistivity nomograph shown in FIG. 3 for the assumed or known sheet resistance. For example, if $R_s$ equals 52 ohms/□ and $R_E$ is determined to be $10^{-3}$ ohms, the contact resistivity $\rho_c$ is determined to be $4 \times 10^{-5}$ ohm-cm$^2$ as shown in FIG. 3.

From the foregoing, it is evident that this CER method of determining contact resistivity, $\rho_c$, of photovoltaic cells is simple and direct, and that it may be used on new cells for production quality control as well as old cells that have been in use for failure and other analysis. It requires only that the collector contact segments be isolated by laser or other scribing means. However, it does require that the sheet resistance under the contact, $R_{sk}$, be known or assumed to be equal to sheet resistance $R_s$. The latter is known from measurement of the semiconductor before metallization of the collector grid. If not, or if it cannot be assumed that $R_{sk}$ is substantially equal to $R_s$, it becomes necessary to measure $R_{sk}$. That can be done using the known TLM technique, such as described by Reeves and Harrison, *IEEE Elect. Div. Lett.*, Vol. EDL-3, No. 5, May 1982. However, in order to do that, it is necessary to have three or more successive pairs of contacts of different line-to-line spacing.

PV device collector grid patterns could be modified easily to permit collection of both $R_E$ and $R_{sk}$ information. FIG. 6 shows one possible pattern using a grid-line modification for three lines that are otherwise at a typical line-to-line spacing of s. The modification is made between the bus bars 14 where the lines 16 are to be scribed. If this test pattern is incorporated into a solar cell collector pattern and the scribe lines are made, a simple test pattern is produced on the surface of the cell for both $R_E$ and $R_{sk}$. This allows determination $R_c$ as well, once $R_E$ and $R_{sk}$ are determined. If the scribe lines are not made, the performance of the solar cell is substantially the same as a solar cell without the modified grid lines.

Since the TLM portion of the test pattern is not optimized, contact resistivity values below $1 \times 10^{-5}$ ohm-cm$^2$ would be difficult to measure with line-to-line spacings of the typical collector grid lines in the 0.25 cm range. Concentrator PV cells would have closer grid lines, permitting determination of smaller values of contact resistivity. In either case, the test pattern scribed may include three conductor segments at the typical line-to-line spacing, as shown in FIG. 4, in addition to the lines with modified spacing shown in FIG. 6 by simply scribing three additional lines. But if the pattern shown in FIG. 6 is available on a cell, then in practice only the modified grid lines need be scribed. This is for the reason that while the TLM measurements require the different spacings, the contact end resistance measurements can also be made using three adjacent lines at unequal spacing using the same methods described earlier for equally spaced lines. Therefore, the three modified grid lines can be used for both types of measurements. Note that actually four contact segments are provided for the TLM measurements which should use at least three unequal spacings between segments defined by four segments, while contact end resistance measurements require only three adjacent grid lines.

Although particular embodiments of the invention have been described and illustrated herein, it is recognized that modifications and variations may readily occur to those skilled in the art, particularly in the pattern of collector grid contacts, and where the isolated segments are to be provided by scribing at least three parallel portions of grid contacts. For example, the grid pattern may be radial, with three radial contacts modified to be parallel over the length of the segments to be isolated. Still other geometries for the grid contact pattern, and segments scribed therefrom will occur to those skilled in the art, particularly in the case of providing four unequally spaced isolated segments for TLM measurements. Consequently, it is intended that the claims be interpreted to cover such modifications and variations.

What is claimed is:

1. A method for measuring the quality of contact resistivity of collector grid contacts on photovoltaic cells using contact end resistance measurements, comprising the steps of making parallel cuts through grid contacts at right angles to an array of at least three parallel collector grid contacts on a photovoltaic cell, thereby isolating segments of the parallel contacts between the cuts, applying a constant known current between a first two of said segments and measuring the voltage between a second two of said segments, where at least one of the said first and second two segments is common, determining resistance as a ratio of measured voltage and applied current, determining contact resistivity as a function of contact end resistance, and sheet resistance under the contact from a nomograph.

2. A method as defined in claim 1 wherein said current is applied between said first two segments which are adjacent and said voltage is measured between said second two segments which are adjacent-only one of said first and second two segments being common, whereby the contact end resistance is determined directly as the ratio of the voltage measurement and applied current.

3. A method as defined in claim 1 wherein said current is applied between a pair of adjacent segments and two voltage measurements are made, one between said pair of adjacent segments and the other between a pair of nonadjacent segments, whereby the contact end resistance is determined as the ratio of the difference in the voltage measurements and applied current.

4. A method as defined in claim 1 wherein said voltage is measured between a pair of adjacent segments, first with said current applied between said pair of adjacent segments and then with said current applied between a pair of nonadjacent segments, whereby the contact end resistance is determined as the ratio of the difference in the voltage measurements and applied current.

5. A method as defined in claim 1, 2, 3, or 4 wherein sheet resistance for the cell is known and said nomograph provides contact resistivity as a function of contact end resistance and sheet resistance, and said sheet resistance under the contact is assumed to be equal to said known sheet resistance.

6. A method as defined in claim 1, 2, 3, or 4 wherein said segments are unequally spaced and said sheet resistance under the contact is determined by a transmission line model technique.

7. In a photovoltaic cell having a plurality of electrically interconnected grid contacts for collection of solar current generated by the cell, an improvement comprised of at least three parallel segments of said grid contacts electrically isolated for use in determining parameters of the cell by applying a constant current between a first pair of isolated segments and measuring voltage between a second pair of isolated segments, where said first and second pairs are selected from among said isolated segments and have at least one segment of each pair in common.

8. An improvement as defined in claim 7 wherein said electrically isolated grid contact segments are uniformly spaced.

9. An improvement as defined in claim 7 wherein said electrically isolated grid contact segments are segments of uniformly spaced parallel grid contacts.

10. An improvement as defined in claim 7 wherein said electrically isolated grid contact segments are at least four in number and are unequally spaced.

11. An improvement as defined in claim 10 wherein three of said four electrically isolated grid contact segments are segments of uniformly spaced parallel grid contacts, and a fourth electrically isolated grid contact segment is provided between two of said three electrically isolated grid contact segments.

* * * * *